(12) United States Patent
Osako et al.

(10) Patent No.: US 11,975,754 B2
(45) Date of Patent: May 7, 2024

(54) SENSOR DEVICE AND STEERING WHEEL

(71) Applicant: ALPS ALPINE CO., LTD., Tokyo (JP)

(72) Inventors: Hajime Osako, Vastra Frolunda (SE); Kenji Kawano, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 178 days.

(21) Appl. No.: 17/444,920

(22) Filed: Aug. 12, 2021

(65) Prior Publication Data

US 2021/0371001 A1 Dec. 2, 2021

Related U.S. Application Data

(63) Continuation of application No. PCT/JP2020/008999, filed on Mar. 3, 2020.

(30) Foreign Application Priority Data

Mar. 25, 2019 (JP) .................................. 2019-057316

(51) Int. Cl.
*B62D 1/04* (2006.01)
*B62D 1/06* (2006.01)
*G01D 5/24* (2006.01)

(52) U.S. Cl.
CPC ............. *B62D 1/046* (2013.01); *B62D 1/06* (2013.01); *G01D 5/24* (2013.01)

(58) Field of Classification Search
CPC ............. B62D 1/046; B62D 1/06; G01D 5/24
See application file for complete search history.

(56) References Cited

U.S. PATENT DOCUMENTS

| 8,983,732 B2 * | 3/2015 | Lisseman ............. B60K 28/066 |
| | | 701/45 |
| 9,248,851 B2 * | 2/2016 | Van'tZelfde ........... B62D 1/046 |
| 9,274,619 B2 | 3/2016 | Okuyama |
| 9,931,935 B2 | 4/2018 | Koch et al. |

(Continued)

FOREIGN PATENT DOCUMENTS

| JP | 2014-029576 | 2/2014 |
| JP | 2014-189183 | 10/2014 |

(Continued)

OTHER PUBLICATIONS

International Search Report for PCT/JP2020/008999 dated Jun. 2, 2020.

(Continued)

*Primary Examiner* — Thomas C Diaz
(74) *Attorney, Agent, or Firm* — IPUSA, PLLC

(57) ABSTRACT

A capacitive sensor device for use with a steering wheel is provided. The steering wheel includes a rim and a spoke that is connected to the inner side of the rim, and the sensor device is provided on the spoke. The sensor device includes an electrode configured to be capacitively coupleable to an object to be detected, and includes a controller configured to detect a change in capacitance of the electrode, and determine whether the object is in proximity to the rim or the spoke based on the change in the capacitance of the electrode. The change in the capacitance occurs in response to the object being in proximity to the rim or the spoke.

13 Claims, 8 Drawing Sheets

(56) References Cited

U.S. PATENT DOCUMENTS

| | | | |
|---|---|---|---|
| 10,077,064 B2 | 9/2018 | Iguchi et al. | |
| 10,124,823 B2 * | 11/2018 | Van'tZelfde | B62D 1/065 |
| 10,807,628 B2 * | 10/2020 | Tsuji | B62D 1/046 |
| 2005/0052426 A1 | 3/2005 | Hagermoser et al. | |
| 2013/0090807 A1 | 4/2013 | Kojima et al. | |
| 2014/0339211 A1 | 11/2014 | Barfuss et al. | |
| 2015/0307022 A1 * | 10/2015 | Nelson | B62D 1/046 |
| | | | 701/36 |
| 2015/0369633 A1 * | 12/2015 | Karasawa | B62D 1/04 |
| | | | 324/686 |
| 2016/0216803 A1 | 7/2016 | Tanaka | |
| 2017/0282956 A1 | 10/2017 | Odate et al. | |
| 2018/0107294 A1 | 4/2018 | Stotzem et al. | |

FOREIGN PATENT DOCUMENTS

| | | | | |
|---|---|---|---|---|
| JP | 2015-147531 | | 8/2015 | |
| JP | 2016190570 A | * | 11/2016 | B62D 1/04 |
| JP | 2017-088089 | | 5/2017 | |
| JP | 2017-154624 | | 9/2017 | |
| JP | 2019-202446 | | 11/2019 | |
| KR | 10-2018-0130069 | | 12/2018 | |
| WO | 2012/144217 | | 10/2012 | |
| WO | 2017/120050 | | 7/2017 | |

OTHER PUBLICATIONS

Office Action for EP20778056.0 dated May 4, 2023.
Office Action for JP2022-153325 dated Jun. 6, 2023.
Office Action for JP2022-153326 dated Jun. 6, 2023.

\* cited by examiner

SENSOR DEVICE AND STEERING WHEEL

CROSS-REFERENCE TO RELATED APPLICATIONS

This application is a continuation of International Application No. PCT/JP2020/008999, filed on Mar. 3, 2020 and designating the U.S., which claims priority to Japanese Patent Application No. 2019-057316, filed on Mar. 25, 2019. The contents of these applications are incorporated herein by reference in their entirety.

BACKGROUND OF THE INVENTION

1. Field of the Invention

The disclosures herein relate to a sensor device and a steering wheel.

2. Description of the Related Art

When a driver drives a vehicle such as an automobile, the driver can change the driving direction of the vehicle by turning a steering wheel while holding the steering wheel. The steering wheel is also referred to as a driving wheel.

Such a steering wheel may include a sensor device configured to detect whether a driver is holding the steering wheel. Specifically, an electrode (such as a capacitive sensor), configured to detect whether a driver is holding the rim of the steering wheel, may be provided inside the rim of the steering wheel. In addition, a heater may also be provided inside the rim of the steering wheel such that the driver does not feel cold when the driver's hand contacts or is placed in proximity to the steering wheel. However, if the heater is provided inside the rim of the steering wheel, the detection accuracy of the sensor device may be decreased due to external influences such as an electromagnetic field formed around the heater and a change in detection sensitivity associated with a temperature change.

RELATED-ART DOCUMENTS

Patent Documents

Patent Document 1: Japanese Laid-Open Patent Publication No. 2015-147531

SUMMARY OF THE INVENTION

It is desirable to provide a sensor device that can detect whether a person's hand contacts or is in proximity to a steering wheel with high accuracy.

According to at least one embodiment, a capacitive sensor device for use with a steering wheel is provided. The steering wheel includes a rim and a spoke that is connected to the inner side of the rim, and the sensor device is provided on the spoke. The sensor device includes an electrode configured to be capacitively coupleable to an object to be detected, and includes a controller configured to detect a change in capacitance of the electrode, and determine whether the object is in proximity to the rim or the spoke based on the change in the capacitance of the electrode. The change in the capacitance occurs in response to the object being in proximity to the rim or the spoke.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1:
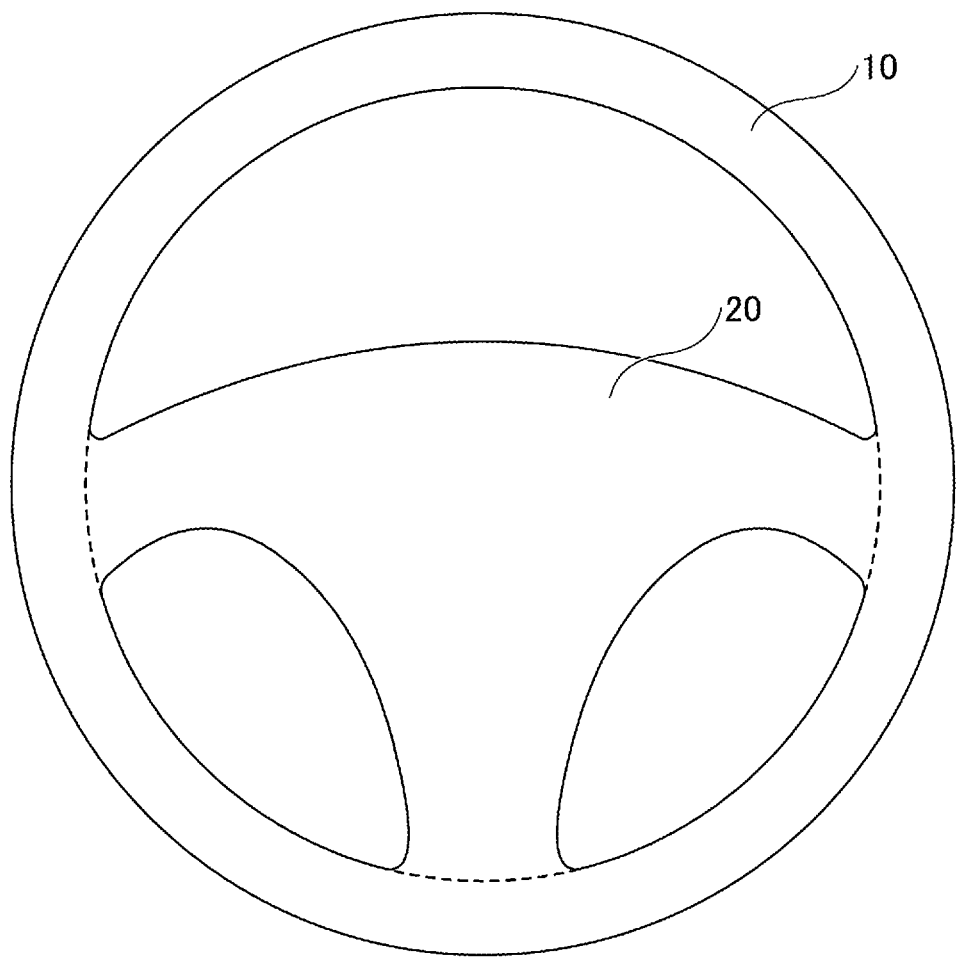
FIG. 1 is a diagram illustrating a related-art steering wheel.

According to at least one embodiment, a sensor device can detect, with high accuracy, whether a person's hand contacts or is in proximity to a rim or a spoke of a steering wheel in conditions in which a capacitive sensor is unable to be provided inside the rim.

In the following, embodiments of the present invention will be described. The same elements are denoted by the same reference numerals, and the description of the same elements will not be repeated.

(Description of Related-Art Steering Wheels)

First, related-art steering wheels will be described with reference to FIG. 1 through FIG. 3. As illustrated in FIG. 1, a steering wheel used in a vehicle typically includes an annular rim 10 and a spoke 20. The spoke 20 is connected to the inner side of the rim 10 and is also connected to a steering column (not illustrated). Typically, when a driver drives a vehicle, the driver operates or turns the steering wheel while holding the rim 10 with the hands. In the automobile market, self-driving vehicles have been introduced in recent years. However, because a self-driving function is considered to be a driving support function, even if a vehicle has a self-driving function, the driver is still required by law to place their hands on the steering wheel while driving. In light of this, it is preferable for self-driving vehicles to have a function to determine whether a driver's hand is placed at a position where the driver can immediately operate the steering wheel, and alert the driver in response to determining that the driver's hand is not placed at a position where the driver can immediately operate the steering wheel. For example, a steering wheel including a capacitive sensor inside a rim 10 is devised so as to determine whether one or both of a driver's hands are holding the steering wheel.

Further, vehicles may be used in cold regions. In such a case, if a steering wheel is excessively colder than the body temperature of a driver, the driver would feel cold when the driver contacts the steering wheel with the hands. As a result, it may be difficult for the driver to touch the steering wheel for a long period of time, and the driver's driving may be hindered. For this reason, the steering wheel may include a heater inside a rim 10 so as to heat and warm the rim 10 of the steering wheel while the driver is driving the vehicle. Examples of the heater include a heating element that generates heat by causing a current to flow through a heating wire or the like. The heating element is an element that generates heat through the resistance, and may be formed of a metallic material, such as nichrome, having a relatively high resistance.

Accordingly, in the above case, the steering wheel may include both the heater and the sensor, such as a capacitive sensor, inside the rim 10. If the heater is provided inside the rim 10 of the steering wheel, the heater is preferably provided in a part of the rim 10 that is likely to be held by the driver, which may be different from person to person. Similarly, if the sensor such as a capacitive sensor is provided inside the rim 10 of the steering wheel, the sensor is preferably provided in a part of the rim 10 that is likely to be held by the driver, which may be different from person to person.

In view of the above, both the heater and the sensor such as a capacitive sensor may be disposed around the circumference of the rim 10, and one of the heater and the sensor is disposed inward relative to the other. Specific examples will be described with reference to a cross-sectional view of a steering wheel in which a heater is provided around a capacitive sensor as illustrated in FIG. 2, and a cross-sectional view of a steering wheel in which a capacitive sensor is provided around a heater as illustrated in FIG. 3.

Figure 2:
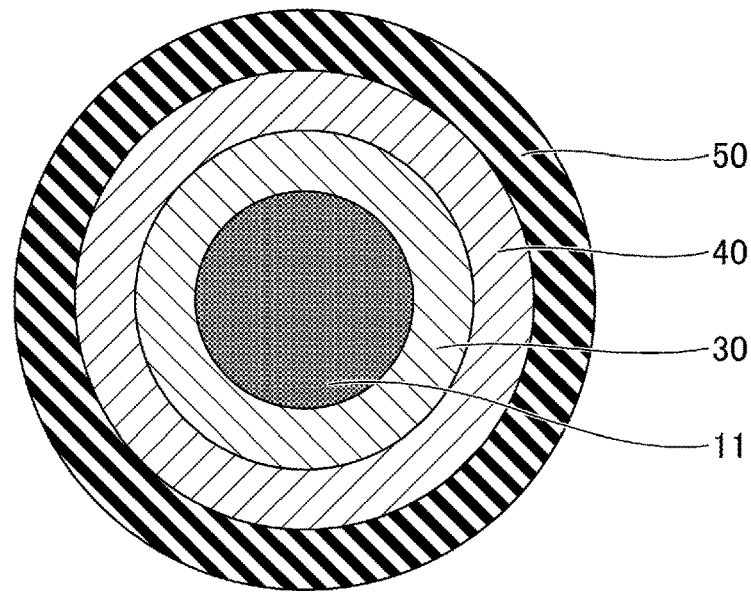
FIG. 2 is a cross-sectional view of a related-art steering wheel in which a heater is provided around a capacitive sensor.

For example, in the steering wheel as illustrated in FIG. 2, a capacitive sensor 30 is provided around a core metal 11 that forms the center portion of a rim 10 of the steering wheel. A heater 40 is provided around the capacitive sensor 30, and an outer skin 50 is provided around the heater 40. With this configuration, when a driver's hand contacts or is in proximity to the rim 10 of the steering wheel, the capacitance of the capacitive sensor 30 changes. A controller (not illustrated) that is electrically connected to the capacitive sensor 30 detects the amount of change in the capacitance, generates a detection signal, and determines whether the driver's hand contacts or is in proximity to the rim 10 of the steering wheel by comparing the detection signal to a predetermined threshold. However, in the example illustrated in FIG. 2, the heater 40 composed of a resistor made of an electrically conductive metal is disposed adjacent to the capacitive sensor 30. Typically, the electrically conductive metal has a large capacitance, and thus, the heater has a large capacitance. Therefore, as compared to when there is no influence of the heater 40, if the heater 40 is disposed adjacent to the capacitive sensor 30, a change in the capacitance of the capacitive sensor 30 would be affected by the heater 40. As a result, the magnitude of a detection signal generated by the controller based on the change in the capacitance of the capacitive sensor 30 would change due to the influence of the heater 40, thus causing the controller to fail to make an accurate determination. Further, a temperature change may cause a change in the capacitance of the capacitive sensor 30. Therefore, if heat from the heater 40 warms the capacitive sensor 30, the magnitude of a detection signal, generated by the controller based on a change in the capacitance of the capacitive sensor 30, would change before and after the capacitive sensor 30 is warmed. Therefore, the controller would be unable to make an accurate determination based on the detection signal.

Figure 3:
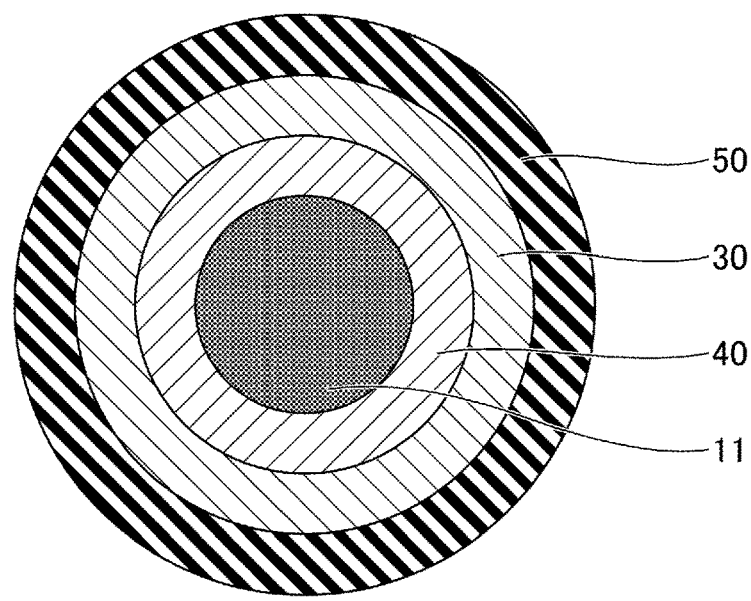
FIG. 3 is a cross-sectional view of a related-art steering wheel in which a capacitive sensor is provided around a heater.

Further, in the steering wheel as illustrated in FIG. 3, a heater 40 is provided around a core metal 11 that forms the center portion of a rim 10 of the steering wheel. A capacitive sensor 30 is provided around the heater 40, and an outer skin 50 is provided around the capacitive sensor 30. With this configuration, heat generated by the heater 40 warms the outer skin 50 via the capacitive sensor 30, and is transferred to the driver's hands. Thus, as compared to the configuration illustrated in FIG. 2, it would take time to warm the rim 10, and power consumed by the heater 40 would also increase.

Further, similar to the configuration illustrated in FIG. 2, in the configuration illustrated in FIG. 3, the electrically conductive heater 40 is disposed adjacent to the capacitive sensor 30. Therefore, the magnitude of a detection signal, generated based on a change in the capacitance of the capacitive sensor 30, would become unstable, thus making it difficult for the controller to make an accurate determination based on the detection signal. Further, similar to the configuration illustrated in FIG. 2, in the configuration illustrated in FIG. 3, if heat generated by the heater 40 warms the capacitive sensor 30, the magnitude of a detection signal, generated based on a change in the capacitance of the capacitive sensor 30, would change before and after the capacitive sensor 30 is warmed. Therefore, it would be difficult for the controller to make an accurate determination based on the detection signal.

As described above, if the capacitive sensor 30 is provided inside the rim 10 in the steering wheel, it may be difficult to accurately determine whether the driver's hand contacts the steering wheel.

Steering Wheel Sensor and Steering Wheel According to First Embodiment

Figure 4:
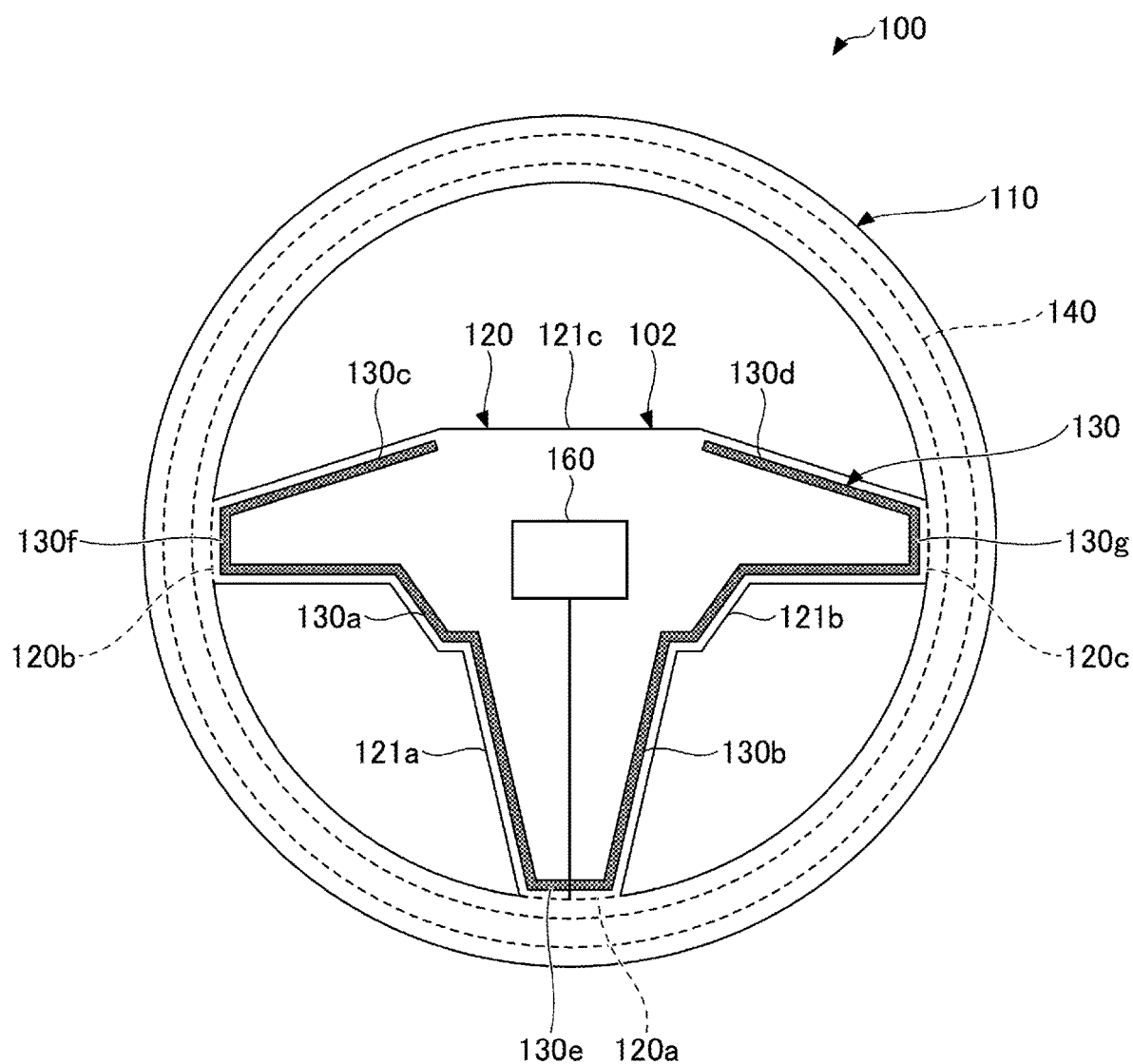
FIG. 4 is a perspective view of a steering wheel according to a first embodiment.

Next, a steering wheel sensor 102 (corresponding to a "sensor device" recited in the claims) according to a first embodiment and a steering wheel 100 (corresponding to a "steering wheel" recited in the claims) will be described with reference to FIG. 4 through FIG. 7. As illustrated in FIG. 4, the steering wheel 100 according to the first embodiment includes a rim 110, a spoke 120, and a steering wheel sensor 102 provided on the spoke 120. The spoke 120 is connected to the inner side of the rim 110 and is also connected to a steering column (not illustrated). The steering wheel sensor 102 includes a capacitive sensor 130 (corresponding to an "electrode" recited in the claims) and a controller 160 (corresponding to a "controller" recited in the claims). The capacitive sensor 130 can be capacitively coupled to an object (hereinafter referred to as an "operation body") to be detected and having a capacitance. In the first embodiment, the capacitive sensor 130 is provided along edge portions 121a, 121b, and 121c, facing the inner peripheral surface of the rim 110, of the spoke 120. A heater 140 configured to heat and warm the rim 110 is provided inside the rim 110. That is, the capacitive sensor 130 and the heater 140 are provided at different positions of the steering wheel 100.

Figure 7:
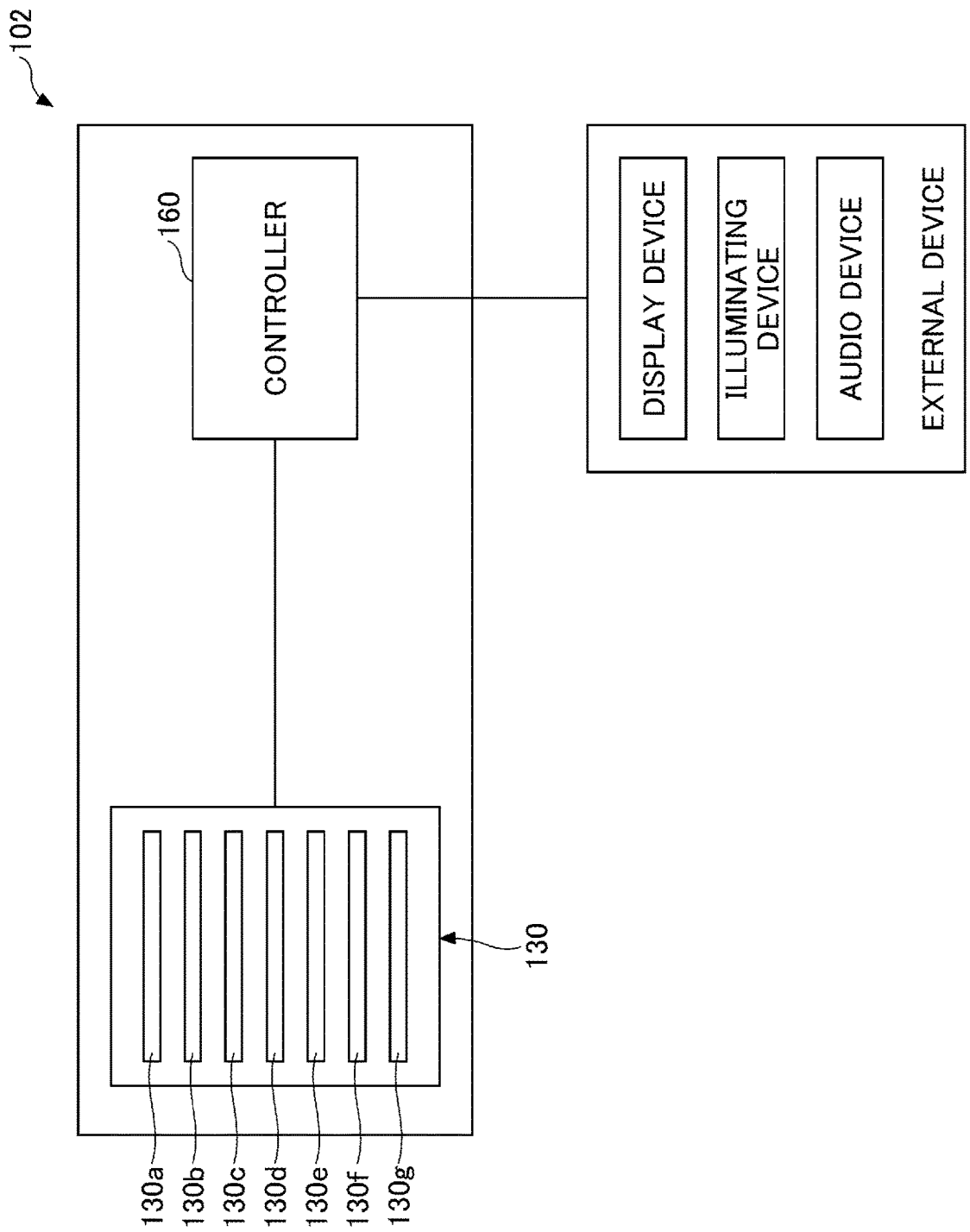
FIG. 7 is a block diagram illustrating the steering wheel sensor according to the first embodiment.

As illustrated in FIG. 7, the controller 160 is electrically connected to the capacitive sensor 130.

In the first embodiment, the controller 160 generates a detection signal based on a change in the capacitance of the capacitive sensor 130, and further performs a coding process on the detection signal so as to facilitate the transmission of the detection signal. The controller 160 communicates with an external device illustrated in FIG. 7 and transmits the detection signal to the external device. The external device determines whether a driver's hand is placed at a position where the driver can immediately operate the steering wheel by comparing the detection signal to a predetermined threshold, and alerts the driver if the driver's hand is not placed at a position where the driver can immediately operate the steering wheel.

Note that the controller 160 may determine whether the driver's hand is placed at a position where the driver can immediately operate the steering wheel.

Accordingly, in the steering wheel 100, because the capacitive sensor 130 is provided away from the heater 140, the possibility that a change in the capacitance of the capacitive sensor 130 is affected by the capacitance of the heater 140 is virtually eliminated. Further, the possibility that a detection signal, generated by the controller 160 based on the change in the capacitance of the capacitive sensor 130, is affected by the capacitance of the heater 140 is virtually eliminated. Further, because the possibility that heat from the heater 140 is transferred to the capacitive sensor 130 is virtually eliminated, the controller 160 can accurately detect whether the driver's hand contacts or is in proximity to the steering wheel without being affected by the heater 140. Further, the heater 140 can efficiently warn the rim 10 without being affected by the heat capacity of the capacitive sensor 130.

Figure 5:
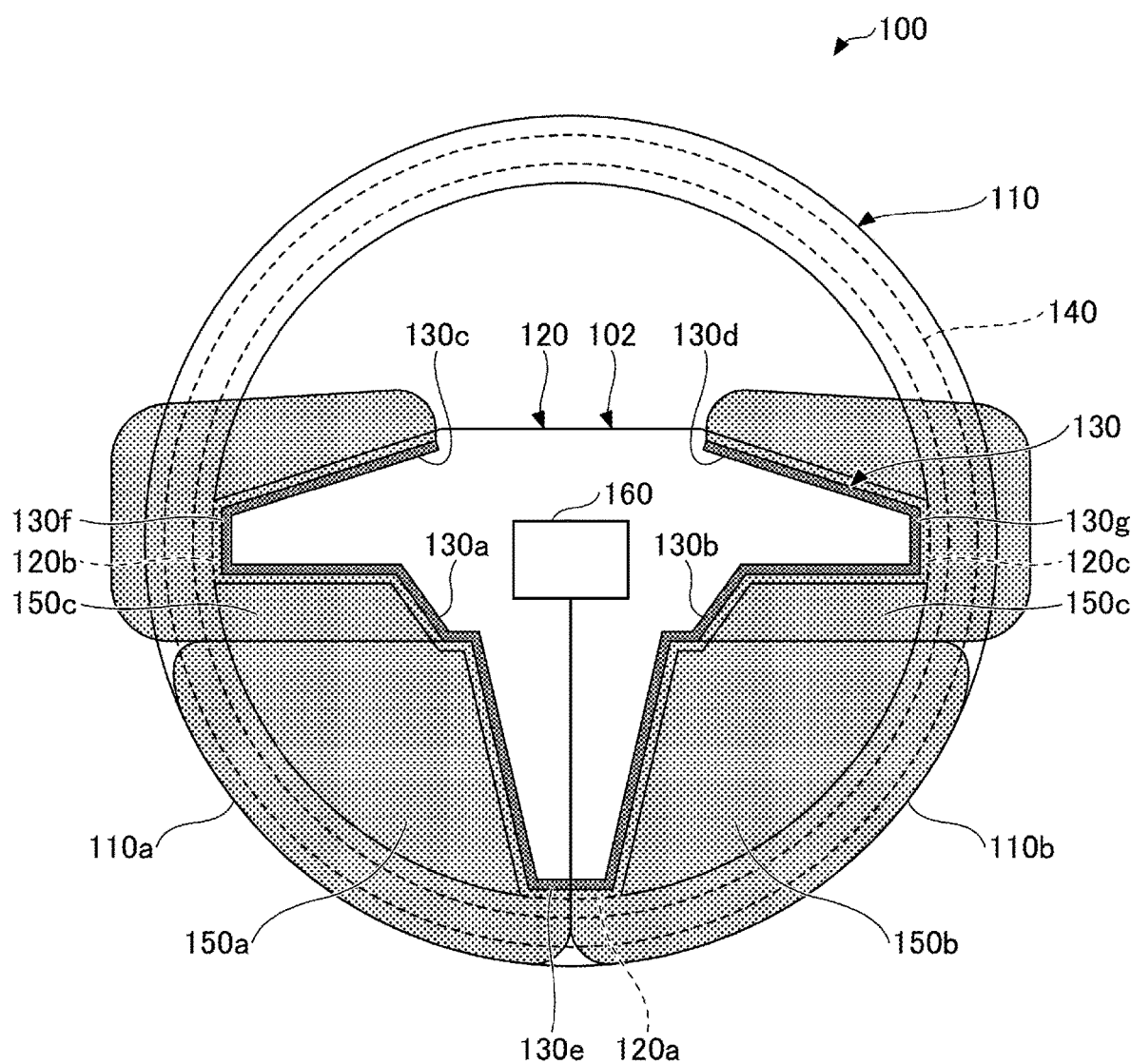
FIG. 5 is a diagram illustrating detection areas of a steering wheel sensor according to the first embodiment.

Note that, while the controller 160 can detect whether the operation body having a capacitance, such as the driver's hand, contacts or is in proximity to the steering wheel based on a change in the capacitance of the capacitive sensor 130, the value of the capacitance of the capacitive sensor 130 depends on the distance between the capacitive sensor 130 and the operation body to be detected. As the operation body approaches the capacitive sensor 130, the value of the capacitance of the capacitive sensor 130 increases, and as the operation body moves away from the capacitive sensor 130, the value of the capacitance of the capacitive sensor 130 decreases. By utilizing the above, the controller 160 can adjust a detection area by adjusting a threshold or by using a plurality of thresholds to be compared to a detection signal generated based on a change in the capacitance of the capacitive sensor 130. For example, as illustrated in FIG. 4, even if the operation body is located in an area furthest from the rim 110, the controller 160 can determine whether the operation body is in proximity to the rim 110 based on a change in the capacitance of a portion (such as 130a or 130b) of the capacitive sensor 130. Specifically, as illustrated in FIG. 5, the controller 160 can determine whether the operation body is located in any of detection areas 150a, 150b, and 150c, which are set in the surroundings of the rim 110 and between the rim 110 and the edge portions 121a, 121b, and 121c, facing the inner peripheral surface of the rim 110, of the spoke 120.

In the first embodiment, the capacitive sensor 130 is included in the steering wheel sensor 102. The driver side of the steering wheel sensor 102 is covered by an exterior panel 125 illustrated in FIG. 5. The capacitive sensor 130 is formed of an electrical conductor such as one line-shaped conductive wire, and is provided along the edge portions of the spoke 120. As illustrated in FIG. 5, the detection areas 150a, 150b, and 150c extend along a plane that includes the rim 110.

Further, the above-described rim 110 and the spoke 120 are connected by connecting portions. Specifically, as illustrated in FIG. 4, connecting portions 120a, 120b, and 120c connect the spoke 120 to the inner side of the rim 110. A space is formed between the rim 110 and a part, extending from the connecting portion 120a to the connecting portion 120b, of the spoke 120. Similarly, a space is formed between the rim 110 and a part, extending from the connecting portion 120a to the connecting portion 120c, of the spoke 120. Similarly, a space is formed between the rim 110 and a part, extending from the connecting portion 120b to the connecting portion 120c, of the spoke 120.

The capacitive sensor 130 of the steering wheel sensor 102 includes a sensor portion 130a (corresponding to a "fragment" recited in the claims). The sensor portion 130a is provided along the edge portion 121a, facing the rim 110, of the spoke 120. The capacitive sensor 130 further includes a sensor portion 130b (corresponding to a "fragment" recited in the claims) provided along the edge portion 121b, facing the rim 110, of the spoke 120. The capacitive sensor 130 further includes sensor portions 130c and 130d (corresponding to "fragments" recited in the claims). The sensor portions 130c and 130d are provided along parts of the edge portion 121c, facing the rim 110, of the spoke 120. The capacitive sensor 130 further includes a sensor portion 130e (corresponding to a "fragment" recited in the claims), a sensor portion 130f (corresponding to a "fragment" recited in the claims), and a sensor portion 130g (corresponding to a "fragment" recited in the claims). The sensor portion 130e is provided along the connecting portion 120a, connecting the spoke 120 to the rim 110, the sensor portion 130f is provided along the connecting portion 120b, and the sensor portion 130g is provided along the connecting portion 120c.

As described above, the sensor portion 130e ("fragment") of the capacitive sensor 130 is provided along the connecting portion 120a, connecting the spoke 120 to the rim 110, the sensor portion 130f ("fragment") of the capacitive sensor 130 is provided along the connecting portion 120b, and the sensor portion 130g ("fragment") of the capacitive sensor 130 is provided along the connecting portion 120c.

Figure 6:
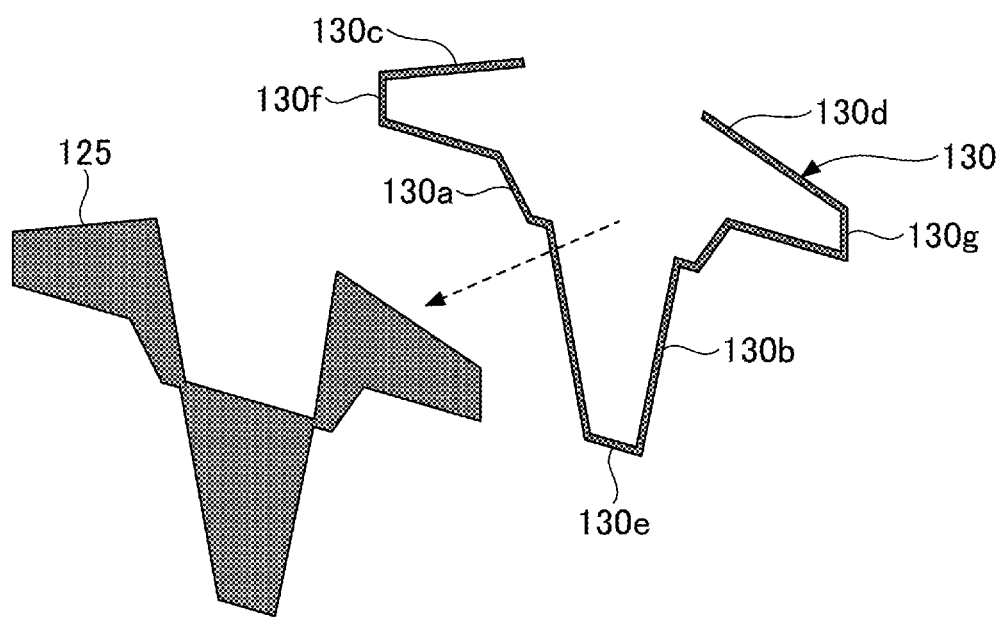
FIG. 6 is a diagram illustrating a partially exploded perspective view of the steering wheel sensor according to the first embodiment.

As illustrated in FIG. 6, the capacitive sensor 130 is formed of one conductive wire. The capacitive sensor 130 includes the sensor portion 130c, the sensor portion 130f, the sensor portion 130a, the sensor portion 130e, the sensor portion 130b, the sensor portion 130g, and the sensor portion 130d, which are connected in this order. In the first embodiment, the capacitive sensor 130 may be formed of two conductive wires. For example, the capacitive sensor 130 may be formed of a conductive wire that includes a part of the sensor portion 130e, the sensor portion 130a, the sensor portion 130f, the sensor portion 130c, and formed of a conductive wire that includes the other part of the sensor portion 130e, the sensor portion 130b, the sensor portion 130g, and the sensor portion 130d.

That is, the outer periphery of the spoke 120 includes the edge portions (121a, 121b, and 121c) and the connecting portions (120a, 120b, and 120c), and the capacitive sensor 130 extends continuously along the outer periphery of the spoke 120.

In a configuration according to the first embodiment, it is assumed that the driver mainly holds lower portions 110a and 110b of the rim 110 while the driver is driving the vehicle. For example, when the lower portion 110a of the rim 110 is held by the driver, the driver's hand is placed in proximity to the sensor portion 130a of the capacitive sensor 130 and within the detection area 150a, thus allowing the driver's hand to be detected. Further, when the lower portion 110b of the rim 110 is held by the driver, the driver's hand is placed in proximity to the sensor portion 130b of the capacitive sensor 130 and within the detection area 150b, thus allowing the driver's hand to be detected.

Further, while the driver is driving the vehicle, the driver's hand may contact a connecting portion between the spoke 120 and the rim 110 or contact the vicinity of the connecting portion. For example, if the driver's hand contacts the connecting portion 120a of the spoke 120 or contacts the vicinity of the connecting portion 120a, the driver's hand is in proximity to the sensor portion 130e of the capacitive sensor 130 and within the detection area 150a or the detection area 150b, thus allowing the driver's hand to be detected by the controller 160. Further, if the driver's hand, approaching the sensor portion 130e of the capacitive sensor 130, is placed in proximity to the connecting portion 120a side of the sensor portion 130a or the connecting portion 120a side of the sensor portion 130b, the driver's hand enters the detection area 150a or the detection area 150b, thus allowing the driver's hand to be detected by the controller 160.

Further, if the driver's hand contacts the connecting portion 120b of the spoke 120 or contacts the vicinity of the connecting portion 120b, the driver's hand is placed in proximity to the sensor portion 130f or the sensor portion 130c and within the detection area 150c, thus allowing the driver's hand to be detected by the controller 160. If the driver's hand contacts the connecting portion 120c of the spoke 120 or contacts the vicinity of the connecting portion 120c, the driver's hand is placed in proximity to the sensor portion 130g or the sensor portion 130d and within the detection area 150c, thus allowing the controller 160 to detect the driver's hand.

Steering Wheel Sensor and Steering Wheel According to Second Embodiment

In the following, a steering wheel sensor and a steering wheel according to a second embodiment will be described with reference to FIG. 8 and FIG. 9. In the second embodiment, the same elements as those of the first embodiment are denoted by the same reference numerals.

Figure 8:
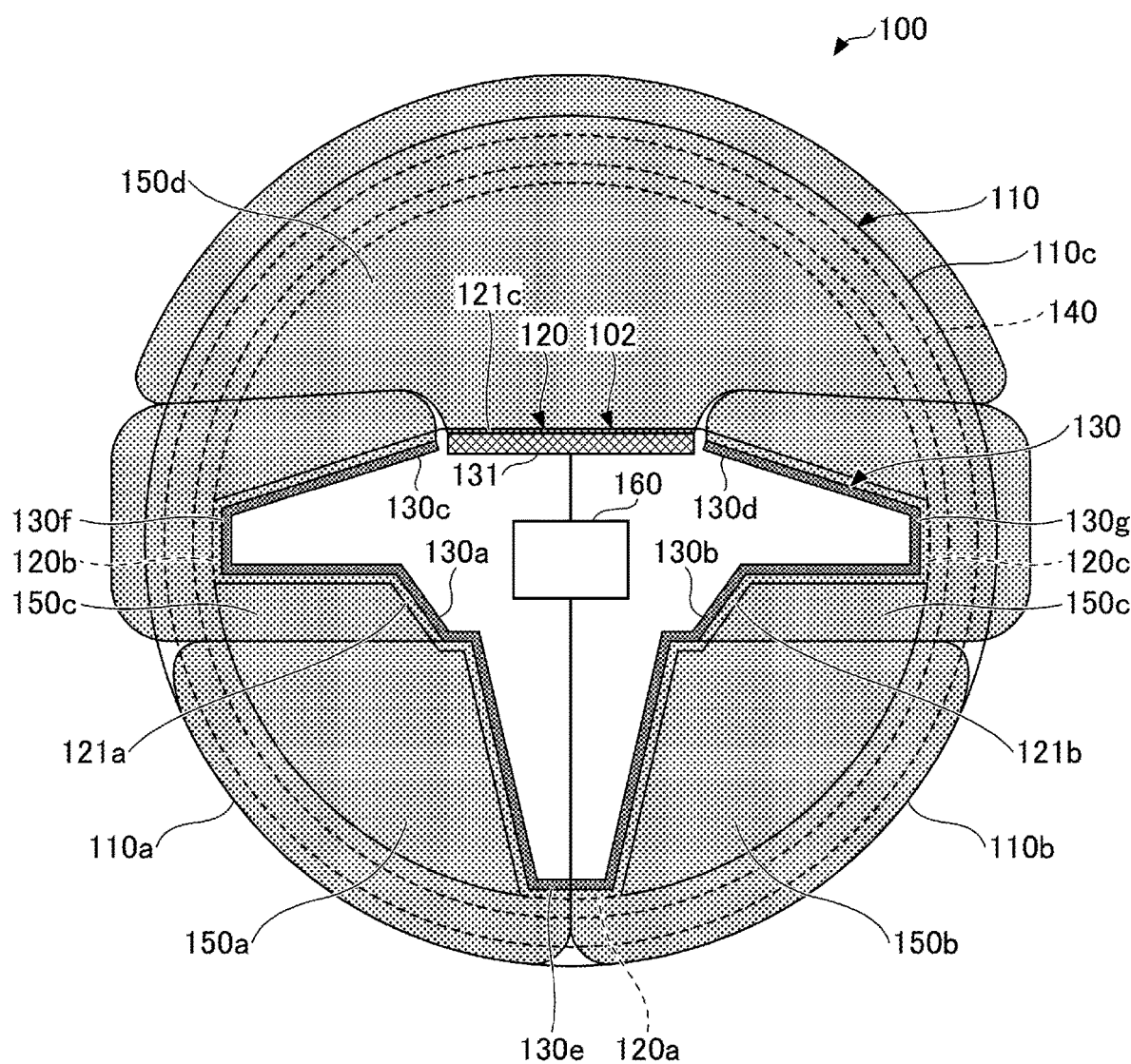
FIG. 8 is a diagram illustrating detection areas of a steering wheel sensor according to a second embodiment.

In a configuration according to the second embodiment, it is assumed that the drive mainly holds an upper portion 110c of the annular rim 110 illustrated in FIG. 8 while the driver is driving the vehicle.

In the second embodiment, as illustrated in FIG. 8, the steering wheel 100 includes the annular rim 110, the spoke 120 that is connected to the inner side of the rim 110, and the steering wheel sensor 102 that is provided on the spoke 120. The connecting portions 120a, 120b, and 120c connect the spoke 120 to the rim 110.

The steering wheel sensor 102 includes the capacitive sensor 130 (corresponding to the "electrode" recited in the claims). The capacitive sensor 130 is provided along the edge portions, facing the inner peripheral surface of the rim 110, of the spoke 120, and can be capacitively coupled to an object ("operation body") to be detected and having a capacitance. Further, the steering wheel sensor 102 includes a capacitive sensor 131 (corresponding to the "electrode" recited in the claims). The capacitive sensor 131 is provided along the edge portion, facing the inner peripheral surface of the rim 110, of the spoke 120, and can be capacitively coupled to the operation body having a capacitance. Further, the steering wheel sensor 102 includes the controller 160 that is electrically connected to the capacitive sensor 130 and to the capacitive sensor 131.

The capacitive sensor 130 includes the sensor portions 130a and 130b (corresponding to the "fragments" recited in the claims). The sensor portions 130a and 130b are provided along the lower edge portions 121a and 121b, facing the inner peripheral surface of the rim 110, of the spoke 120. The capacitive sensor 130 further includes the sensor portion 130c (corresponding to the "fragment" recited in the claims) and the sensor portion 130d (corresponding to the "fragment" recited in the claims). The sensor portion 130c and the sensor portion 130d are provided along parts of the upper edge portion 121c of the spoke 120. The sensor portion 130c is located closer to the connecting portion 120b, and the sensor portion 130d is located closer to the connecting portion 120c.

The capacitive sensor 130 is formed of one conductive wire. The capacitive sensor 130 includes the sensor portion 130c, the sensor portion 130f, the sensor portion 130a, the sensor portion 130e, the sensor portion 130b, the sensor portion 130g, and the sensor portion 130d, which are connected in this order. The sensor portions of the capacitive sensor 130 have different electrical resistance values based on the distances from the rim 110.

The capacitive sensor 131 is provided along a part of the upper edge portion 121c, facing the inner peripheral surface of the rim 110. Further, the capacitive sensor 131 is located at a position where the sensor portion 130c and the sensor portion 130d of the capacitive sensor 130 are not provided.

In the second embodiment, the capacitive sensor 131 is provided along the part of the upper edge portion 121c so as not to overlap the capacitive sensor 130. However, the capacitive sensor 131 may be provided so as to overlap the capacitive sensor 130 to the extent that misdetection does not occur.

Figure 9:
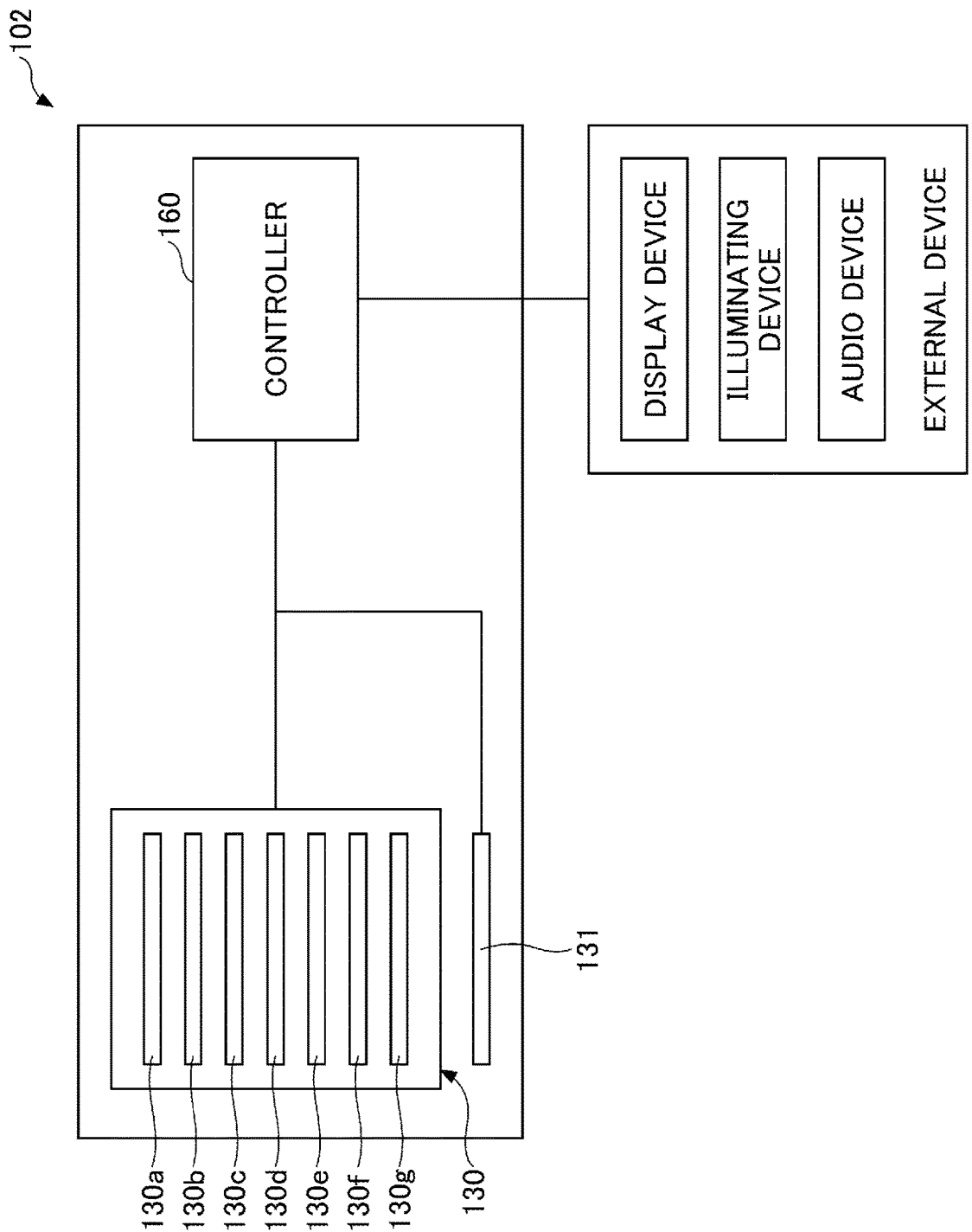
FIG. 9 is a block diagram illustrating the steering wheel sensor according to the second embodiment.

As illustrated in FIG. 9, the capacitive sensor 130 and the capacitive sensor 131 are connected in parallel to the controller 160.

The capacitive sensor 131 has an electrical resistance value different from those of the capacitive sensor 130. As illustrated in FIG. 8, the capacitive sensor 131 is provided along the part of the upper edge portion 121c of the spoke 120, and is located away from the connecting portion 120b and the connecting portion 120c. In other words, the capacitive sensor 131 is provided along the center part of the upper edge portion 121c of the spoke 120. If the spoke 120 has a typical shape, such as a T-shape, the distance between the capacitive sensor 131 and the rim 110 is greater than the distance between the capacitive sensor 130 and the rim 110. Therefore, the detection sensitivity of the capacitive sensor 131 is preferably set to be higher than the detection sensitivity of the capacitive sensor 130.

If the operation body contacts or is placed in proximity to the rim 110, the capacitance of the capacitive sensor 130 or the capacitance of the capacitive sensor 131 changes. When there is a change in the capacitance of the capacitive sensor 130 or in the capacitance of the capacitive sensor 131, the controller 160 detects the change, and generates a detection signal. Based on the detection signal, the controller 160 or an external device illustrated in FIG. 9 determines whether the operation body contacts or approaches the rim 110. At this time, the controller 160 determines whether the operation body contacts or is placed in proximity to the rim 110 by comparing the detection signal to thresholds that are set based on the distances between the rim 110 and the capacitive sensors 130 and 131.

As illustrated in FIG. 8, detection areas 150a, 150b, 150c, and 150d are set in the surroundings of the rim 110, a space between the rim 110 and the capacitive sensor 130, and a space between the rim 110 and the capacitive sensor 131.

If the operation body is located with the detection area 150a, the detection area 150b, the detection area 150c, or the detection area 150d, the capacitance of the capacitive sensor 130 or capacitance of the capacitive sensor 131 changes. The controller 160 detects the change in the capacitance of the capacitive sensor 130 or capacitance of the capacitive sensor 131, and generates a detection signal.

The controller 160 or the external device illustrated in FIG. 9 determines whether the operation body contacts or is placed in proximity to the rim 110 based on the detection signal.

Although the embodiments have been described in detail above, the present invention is not limited to the particulars of the above-described embodiments. Various modifications and variations may be made without departing from the scope of the present invention.

What is claimed is:

1. A sensor device of a capacitive type, the sensor device comprising:
    an electrode configured to be capacitively coupleable to an object to be detected; and
    a controller configured to be coupleable to a steering wheel, the steering wheel including a rim and a spoke that is connected to an inner side of the rim, and the sensor device to be provided, on the spoke, the controller configured to detect a change in capacitance of the electrode, and determine whether the object is in proximity to the rim or the spoke based on the change in the capacitance of the electrode, the change in the capacitance of the electrode occurring in response to the object being in proximity to the rim or the spoke,
    wherein, as viewed from a driver, the electrode is to be provided along edge portions of the spoke, the edge portions facing the rim, and the electrode has a line-shaped form provided along the edge portions of the spoke.

2. The sensor device according to claim 1, wherein the electrode is to be provided along, connecting portions of the spoke that connect the spoke to the rim.

3. The sensor device according to claim 2, wherein an outer periphery of the spoke includes the edge portions and the connecting portions, and the electrode extends continuously along the outer periphery of the spoke.

4. The sensor device according to claim 1, wherein the electrode includes one or more electrical conductors.

5. The sensor device according to claim 1, wherein the electrode includes a plurality of fragments having different electrical resistance values based on distances from the rim.

6. The sensor device according to claim 1, wherein the controller is configured to make the determination by comparing a signal from the electrode to a threshold, the threshold being set based on a distance between the rim and the electrode.

7. The sensor device according to claim 1, wherein a detection area extends along a plane that includes the rim.

8. A steering wheel comprising,
    the sensor device according to claim 1.

9. A steering wheel comprising:
    the sensor device according to claim 1; and
    a heater provided inside the rim and configured to heat the rim.

10. A sensor device of a capacitive type, the sensor device comprising:
    an electrode configured to be capacitively coupleable to an object to be detected; and
    a controller configured to be coupleable to a steering wheel, the steering wheel including a rim and a spoke that is connected to an inner side of the rim, and the sensor device to be provided on the spoke, the controller configured to detect a change in capacitance of the electrode, and determine whether the object is in proximity to the rim or the spoke based on the change in the capacitance of the electrode, the change in the capacitance of the electrode occurring in response to the object being in proximity to the rim or the spoke,
    wherein the electrode includes a plurality of fragments having different electrical resistance values based on distances from the rim.

11. The sensor device according to claim 1, wherein, as viewed from the driver, the line-shaped form of the electrode is a U-shape that is convex toward the rim along the edge portions of the spoke.

12. The sensor device according to claim 1, wherein the controller is configured to make the determination by comparing a signal from the electrode to a plurality of thresholds being set based on a plurality of distances between the rim and one or more electrodes.

13. A sensor device of a capacitive type, the sensor device comprising:
    an electrode configured to be capacitively coupleable to an object to be detected; and
    a controller configured to be coupleable to a steering wheel, the steering wheel including a rim and a spoke that is connected to an inner side of the rim, and the sensor device to be provided on the spoke, the controller configured to detect a change in capacitance of the electrode, and determine whether the object is in proximity to the rim or the spoke based on the change in the capacitance of the electrode, the change in the capacitance of the electrode occurring in response to the object being in proximity to the rim or the spoke,
    wherein the electrode is to be provided along edge portions of the spoke, the edge portions facing the rim, and the controller is configured to make the determination by comparing a signal from the electrode to a plurality of thresholds being set based on a plurality of distances between the rim and one or more electrodes.

\* \* \* \* \*